(12) United States Patent
Stoecklein et al.

(10) Patent No.: US 6,617,766 B1
(45) Date of Patent: Sep. 9, 2003

(54) PIEZOELECTRIC ACTUATOR

(75) Inventors: Wolfgang Stoecklein, Stuttgart (DE); Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/018,681

(22) PCT Filed: May 24, 2000

(86) PCT No.: PCT/DE00/01671
§ 371 (c)(1), (2), (4) Date: Apr. 2, 2002

(87) PCT Pub. No.: WO00/79606
PCT Pub. Date: Dec. 28, 2000

(30) Foreign Application Priority Data

Jun. 19, 1999 (DE) .......................... 199 28 185

(51) Int. Cl.$^7$ ...................... H01L 41/053; H01L 41/083
(52) U.S. Cl. ........................................ 310/346; 310/348
(58) Field of Search .................................. 310/346, 348

(56) References Cited

U.S. PATENT DOCUMENTS 4,550,744 A * 11/1985 Igashira et al. ............. 123/447
4,958,101 A * 9/1990 Takahashi et al. ........... 123/498
5,004,945 A * 4/1991 Tomita et al. .............. 123/498
6,313,568 B1 * 11/2001 Sullivan et al. ............. 310/346
6,452,308 B1 * 9/2002 Heinz et al. ................ 310/328

FOREIGN PATENT DOCUMENTS

EP       0319038    * 6/1989    ............ H01L/41/02
EP       0587192    * 3/1994    ............ B41J/2/295
JP       2001-189499 * 7/2001   ......... H01L/41/083

* cited by examiner

Primary Examiner—Thomas M. Dougherty
(74) Attorney, Agent, or Firm—Ronald E. Greigg

(57) ABSTRACT

A piezoelectric actuator in which at least on piezoelectric element is present for subjected an actuating element to a tensile force or compressive force. In addition, stabilizing elements are mounted parallel to the piezoelectric element with a flexible intermediate layer located between the elements. The piezoelectric element and the stabilizing elements have a great length in the effective direction (Z axis) in proportion to their width transversely to the effective direction (X, Y direction).

16 Claims, 2 Drawing Sheets

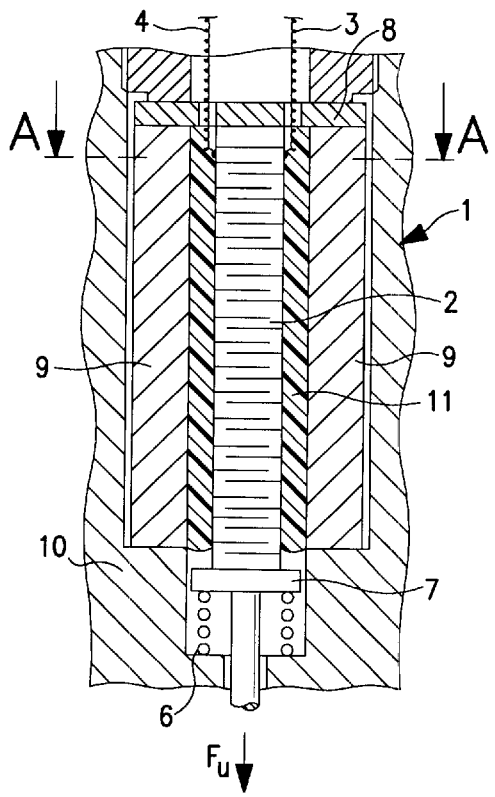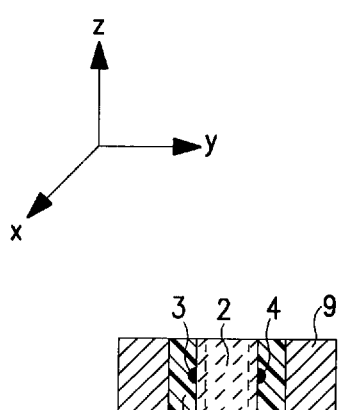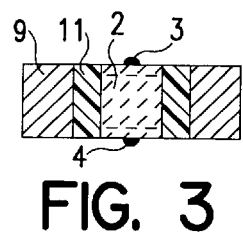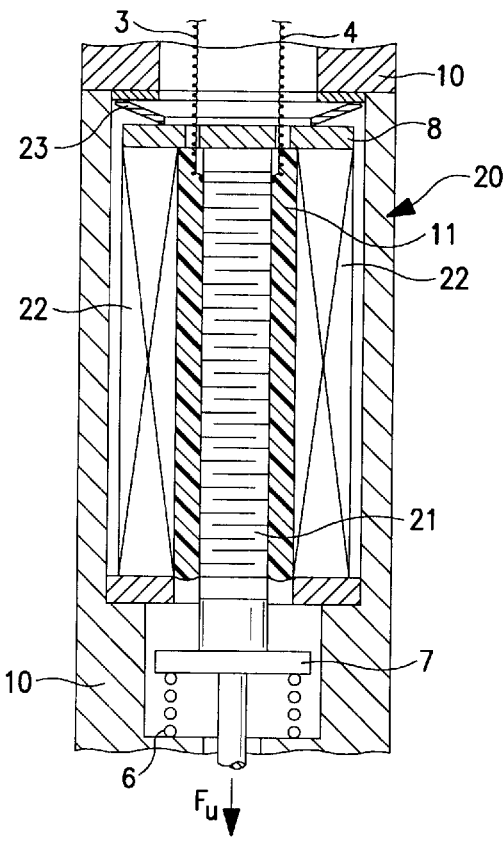
FIG. 1
FIG. 2
FIG. 3
FIG. 4

PIEZOELECTRIC ACTUATOR

CROSS-REFERENCE TO RELATED APPLICATIONS

This application is a 35 USC 371 application of PCT/DE 00/01671 filed on May 24, 2000.

BACKGROUND OF THE INVENTION

1. Field of the Invention

The invention relates to a piezoelectric actuator, for instance for actuating a mechanical component such as a valve or the like.

The invention relates to a piezoelectric actuator, for instance for actuating a mechanical component such as a valve or the like, in accordance with the generic characteristics of the preamble to the main claim.

2. Description of the Prior Art

The aforementioned piezoelectric actuators are often used in the positioning of valves. Among other factors, it must be considered here that their stroke capacity for actuating a valve tappet, for instance, is relative slight for a comparatively great force. To increase the useful stroke, it is therefore known to provide a mechanical or hydraulic travel booster. Such mechanical or hydraulic travel boosting systems, however, entail greater effort and therefore greater expense as well.

It is widely known that by utilizing the so-called piezoelectric effect, a piezoelectric element can be constructed from a material with a suitable crystalline structure. When an external electrical voltage is applied, a mechanical reaction of the piezoelectric element takes place, which depending on the crystalline structure and the regions where the electrical voltage is applied causes a compression or tension in a predeterminable direction.

The aforementioned piezoelectric actuators are often used in the positioning of valves. Among other factors, it must be considered here that their stroke capacity for actuating a valve tappet, for instance, is relative slight for a comparatively great force. To increase the useful stroke, it is therefore sometimes usual to provide a mechanical or hydraulic travel booster. Such mechanical or hydraulic travel boosting systems, however, entail greater effort and therefore greater expense as well.

SUMMARY OF THE INVENTION

The piezoelectric actuator described at the outset advantageously has at least one piezoelectric element, which is suitable for imposing a tensile force or compressive force on an actuating element. According to the invention, stabilizing elements are provided, which are disposed parallel to the piezoelectric element with a flexible intermediate layer located between the elements, wherein the piezoelectric element and the stabilizing elements have a great length in the effective direction (Z axis) in proportion to their width transversely to the effective direction (X, Y direction). An advantageous order of magnitude would for instance be a ratio of length (Z direction) to width (X, Y direction) is approximately 5:1 to 50:1.

In a first advantageous embodiment, the stabilizing elements are of steel and are held between a base or support plate fastened firmly in the housing of the piezoelectric actuator and a fixation edge in the housing. The housing here is as a rule also made from steel. The piezoelectric element is held between the base plate and a spring plate which, via a prestressing spring, likewise rests on the housing and guides the actuating element.

With the invention, a long, narrow piezoelectric actuator is created in a simple way that is mechanically relatively invulnerable, for instance to vibration when used in the engine compartment of a motor vehicle. Because of the long stroke resulting from the long, narrow design, a stroke boost can be dispensed with, and in principle, tensile forces or compressive forces can be generated by the piezoelectric actuator.

Because a flexible intermediate layer, for instance of plastic such as a polymer or the like, is mounted between the stabilizing elements and the piezoelectric element, a longitudinal motion, which represents a relative motion between the piezoelectric element and the stabilizing element, can be allowed. An oscillating motion of the piezoelectric element in the X or Y direction can be avoided, however. It is thus possible in a simple way to prevent bending tensions in the piezoelectric element that could possibly lead to the destruction of the piezoelectric actuator.

The aforementioned concrete embodiment furnishes downward-oriented compressive forces and is not temperature-compensated. In a second embodiment, the piezoelectric element and the stabilizing elements are of ceramic materials, which have essentially the same coefficients of temperature expansion, so that this embodiment is temperature-compensated. The stabilizing element is here as well held between a base plate and a fixation edge in the housing, but the base plate rests on the housing via a spring.

In this last embodiment, the stabilizing element is mechanically coupled to the piezoelectric element in such a way that the temperature-dictated expansions of the piezoelectric element and of the stabilizing elements cancel one another out in the effective direction in such a way that the actuating element remains in its position, or in other words no zero-point drift occurs. The piezoelectric element is held between the base plate and a spring plate, which via a prestressing spring likewise rests on the housing and guides the actuating element. Here the force of the prestressing spring must be substantially greater than that of the spring on the base plate, so that the different temperature expansions between the housing and the material comprising the piezoelectric element are compensated for via the spring. Additional provisions for temperature compensation, as was often provided until now by hydraulic coupling, are no longer necessary here.

In the invention, the piezoelectric element can be constructed of transversely stacked piezoelectric layers and thus exerts a compressive force on the actuating element, or of longitudinally stacked piezoelectric layers and thus exerts a tensile force on the actuating element.

In other advantageous embodiments, the stabilizing element comprises piezoelectric layers, each located perpendicular to the layered structure of the piezoelectric element, which piezoelectric layers are triggered with a voltage in the same way as the piezoelectric element. With this embodiment, in addition to the temperature compensation, the useful stroke is also lengthened by means of the additional stroke of the stabilizing elements. The contacting of the piezoelectric layers can be located in the intermediate layer or outside it.

In another advantageous embodiment of the invention, two piezoelectric elements are disposed symmetrically to a tension rod, acting as the actuating element, surrounded by the intermediate layer in the housing of the piezoelectric actuator. The piezoelectric elements here are held between a support plate, connected to the tension rod, and a fixation edge in the housing, and the support plate rests on the housing via a spring.

These and other characteristics of preferred refinements of the invention will become apparent from the description and the drawings; the individual characteristics, each alone or a plurality of them in the form of subsidiary combinations, can be realized in the embodiment of the invention and in other fields and can represent both advantageous and intrinsically patentable embodiments for which patent protection is here claimed.

BRIEF DESCRIPTION OF THE DRAWINGS

Exemplary embodiments of the piezoelectric actuator of the invention with a narrow design, for instance for positioning a valve, will be explained in conjunction with the drawings, in which:

FIG. 1, a section through a non-temperature-compensated piezoelectric actuator with steel stabilizing elements;

FIG. 2, a detail taken along a section line A—A of FIG. 1, with a first contacting option for the piezoelectric element;

FIG. 3, a detail taken along a section line A—A of FIG. 1, with a second contacting option for the piezoelectric element;

FIG. 4, a section through a temperature-compensated, transversely stacked piezoelectric element of the piezoelectric actuator, with a ceramic stabilizing element;

DESCRIPTION OF THE PREFERRED EMBODIMENTS

Figure 5:
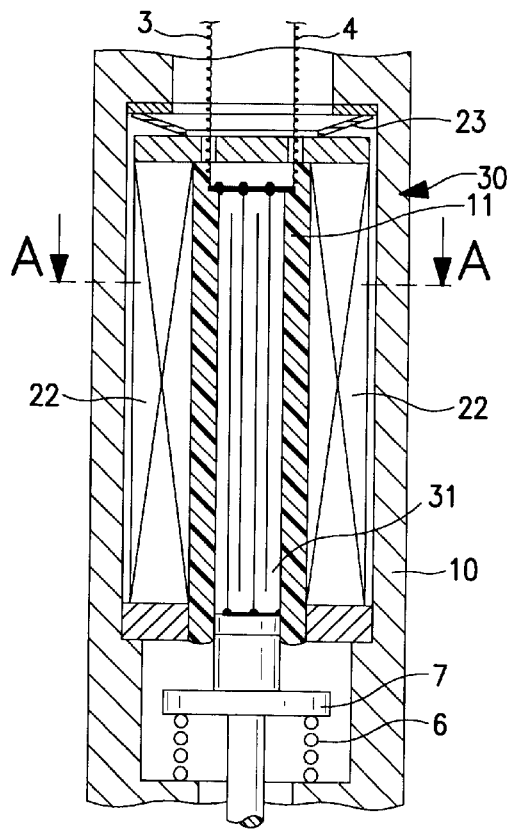
FIG. 5, a section through a temperature-compensated, longitudinally stacked piezoelectric element of the piezoelectric actuator, with a ceramic stabilizing element.

In FIG. 1, a piezoelectric actuator 1 is shown that has a piezoelectric element 2, which in a manner known per se is constructed of piezoelectric sheets of a quartz material with a suitable crystalline structure, so that by utilizing the so-called piezoelectric effect upon application of an external electrical voltage to electrodes 3 and 4, a mechanical reaction of the piezoelectric actuator 1 is effected, in the form of a useful force $F_u$. The exemplary embodiment in FIG. 1 is not temperature-compensated and furnishes a compressive force $F_u$.

The relatively long, slender piezoelectric element 2 is pressed by its upper end against a base or support plate 8 by means of a prestressing spring 6 and a spring plate 7, disposed above this spring, on the lower end of the piezoelectric element. The support plate 8 is braced with stabilizing elements 9, disposed symmetrically on both sides of the piezoelectric element 2, which are braced at the top and bottom on the housing 10 of the piezoelectric actuator 1. Between the stabilizing elements 9 and the piezoelectric element 2 is a flexible plastic, such as a polymer, located longitudinally in the form of an intermediate layer 11. The task of the flexible intermediate layer 11 is to allow a longitudinal motion, that is, the relative motion between the piezoelectric element 2 and the stabilizing elements 9, but to prevent an oscillating motion of the piezoelectric element in the X or Y direction.

From FIGS. 2 and 3, possibilities for a connection of the contacts 3 and 4 of the piezoelectric element 2 are suggested; these can be effected in either the X or Y direction and can thus be located either in the intermediate layer 11 or outside it.

A second exemplary embodiment of a piezoelectric actuator 20 is shown in FIG. 4; here, components functioning the same are identified by the same reference numerals as in FIG. 1. In the arrangement of FIG. 4, there is one piezoelectric element 21, and there are stabilizing elements 22 that are made from a ceramic material with approximately the same coefficient of temperature expansion as the piezoelectric element 21. The support plate 8 is prestressed here in the housing 10 via a spring 23; the prestressing force of the spring 23 must be substantially greater than that of the prestressing spring 6, so that the different temperature expansions between the housing 10 and the piezoelectric element 21 can be compensated for via the spring 23. However, it is also possible to omit the spring 23. Then the piezoelectric element 21 would be held together by the upper support plate 8, analogously to what FIG. 1 shows, and optionally also by a lower support plate. The upper support plate 8 would, as in FIG. 1, rest on a shoulder of the housing 10. The spring 23 prevents the stabilizing element 22 from being subject to tensile stress that can be caused by the prestressing of the piezoelectric element. This prestressing is accomplished with the aid of the spring 6.

An actuation of the piezoelectric actuator 20, in this exemplary embodiment as well, leads to an axial expansion of the piezoelectric element 21 and thus to a compressive force $F_u$ counter to the prestressing of the prestressing spring 6. Since here as well the piezoelectric element 21 and the stabilizing elements 22 have essentially the same coefficients of temperature expansion, the temperature-caused expansions of the piezoelectric element 21 and of the stabilizing elements 22, in the proposed mechanical mounting, cause the influences of the two elements 21 and 22 to be cancelled out in the effective direction. Thus the actuating element, connected to the spring plate 7 of the piezoelectric element 21, can remain in its position.

A third exemplary embodiment of a piezoelectric actuator 30 is shown in FIG. 5; once again, components that function the same are provided with the same reference numerals as in FIG. 1 or FIG. 4. In the arrangement of FIG. 5, in contrast to the disposition of FIG. 4, only a piezoelectric element 31 with longitudinally stacked piezoelectric layers is provided. An actuation of the piezoelectric actuator 30 in this exemplary embodiment leads to an axial shortening of the piezoelectric element 31 and thus to useful tensile force $F_u$ that acts on the actuating element.

Figure 6:
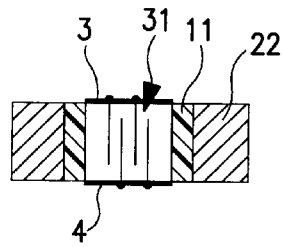
FIG. 6, a detail taken along a section line A—A of FIG. 5, with a first contacting option for the piezoelectric element.
Figure 7:
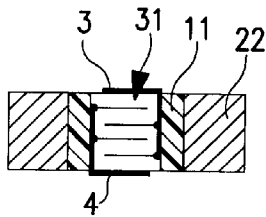
FIG. 7, a detail taken along a section line A—A of FIG. 5, with a second contacting option for the piezoelectric element.

In FIGS. 6 and 7, once again possibilities for a connection of the contacts 3 and 4 of the piezoelectric element 31 are suggested; these can again be effected with suitably oriented piezoelectric layers in either the X or Y direction and can thus be located either in the intermediate layer 11 or outside it.

Figure 8:
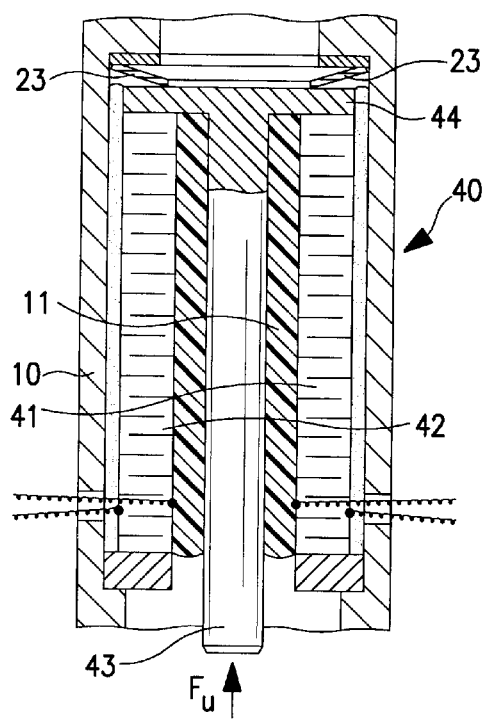
FIG. 8, a section through a non-temperature-compensated piezoelectric actuator with two piezoelectric elements disposed one on either side of a tension rod.

From FIG. 8, a further exemplary embodiment of a piezoelectric actuator 40 can be seen; once again, the components functioning the same are provided with the same reference numerals as in FIG. 1, FIG. 4 or FIG. 5. In the arrangement of FIG. 8, two piezoelectric elements 41 and 42 are disposed symmetrically to a tension rod 43, which represents the actuating element. The piezoelectric elements 41 and 42 and the tension rod 43 are disposed, surrounded by the intermediate layer 11, in the housing 10 of the piezoelectric actuator 40. The piezoelectric elements 41 and 42 here are furthermore held between a support plate 44, connected to the tension rod, and via the spring 23 on an upper fixation edge in the housing 10 and a lower fixation edge in the housing 10. This arrangement furnishes a tensile force as the force $F_u$ and is not temperature-compensated.

The foregoing relate to preferred exemplary embodiments of the invention, it being understood that other variants and embodiments thereof are possible within the spirit and scope of the invention, the latter being defined by the appended claims.

What is claimed is:

1. A piezoelectric actuator comprising a housing (10), in which at least one piezoelectric element (2; 21; 31; 41; 42) for subjecting an actuating element to a tensile force or compressive force is disposed and is guided longitudinally movably by means of a flexible intermediate layer (11), and stabilizing elements (9, 22), disposed parallel to this piezoelectric element (2; 21; 31; 41, 42), to prevent bending tensions in the piezoelectric element (2; 21; 31; 41; 42) said intermediate layer (11) being located between the piezoelectric element (2; 21; 31; 41; 42) and the stabilizing elements (9, 22), the ratio of the length of the piezoelectric element (2; 21; 31; 41; 42) and the stabilizing elements (9, 22) in the effective direction (Z axis) to the width transversely to the effective direction (X, Y direction) is from 5:1 to 50:1.

2. The piezoelectric actuator of claim 1, wherein the stabilizing elements (9) are of steel and are held between a base or support plate (8) fastened firmly in the housing (10) of the piezoelectric actuator (1) and a fixation edge in the housing (10), and wherein the piezoelectric element (2; 21; 31; 41; 42) is held between the base plate (8) and a spring plate (7) which, via a prestressing spring (6), likewise rests on the housing (10) and guides the actuating element.

3. The piezoelectric actuator of claim 1, wherein the piezoelectric element (21; 31) and the stabilizing elements (22) are of ceramic materials, which have essentially the same coefficients of temperature expansion, and the stabilizing elements (22) are held between a base or support plate (8) and a fixation edge in the housing (10), wherein the piezoelectric element (21; 31) is held between the base plate (8) and a spring plate (7), which via a prestressing spring (6) likewise rests on the housing (10) and guides the actuating element, and wherein the stabilizing element (22) is coupled mechanically with the piezoelectric element (21; 31) in such a way that the temperature-dictated expansions of the piezoelectric element (21; 31) and of the stabilizing element (22) cancel one another out in the effective direction in such a way that the actuating element remains in its position.

4. The piezoelectric actuator of claim 3, wherein the base plate (8) rests on the housing (10) via a spring (23).

5. The piezoelectric actuator of claim 2, wherein the piezoelectric element (21) is constructed of transversely stacked piezoelectric layers and thus exerts a compressive force on the actuating element.

6. The piezoelectric actuator of claim 3, wherein the piezoelectric element (21) is constructed of transversely stacked piezoelectric layers and thus exerts a compressive force on the actuating element.

7. The piezoelectric actuator of claim 4, wherein the piezoelectric element (21) is constructed of transversely stacked piezoelectric layers and thus exerts a compressive force on the actuating element.

8. The piezoelectric actuator of claim 2, wherein the piezoelectric element (21) is constructed of longitudinally stacked piezoelectric layers and thus exerts a tensile force on the actuating element.

9. The piezoelectric actuator of claim 3, wherein the piezoelectric element (21) is constructed of longitudinally stacked piezoelectric layers and thus exerts a tensile force on the actuating element.

10. The piezoelectric actuator of claim 4, wherein the piezoelectric element (21) is constructed of longitudinally stacked piezoelectric layers and thus exerts a tensile force on the actuating element.

11. The piezoelectric actuator of claim 5, wherein the stabilizing elements (22) comprise piezoelectric layers, each located perpendicular to the layered structure of the piezoelectric element (21; 31), which piezoelectric layers are triggered with a voltage in the same way as the piezoelectric element (21; 31).

12. The piezoelectric actuator of claim 6, wherein the stabilizing elements (22) comprise piezoelectric layers, each located perpendicular to the layered structure of the piezoelectric element (21; 31), which piezoelectric layers are triggered with a voltage in the same way as the piezoelectric element (21; 31).

13. The piezoelectric actuator of claim 7, wherein the stabilizing elements (22) comprise piezoelectric layers, each located perpendicular to the layered structure of the piezoelectric element (21; 31), which piezoelectric layers are triggered with a voltage in the same way as the piezoelectric element (21; 31).

14. The piezoelectric actuator of claim 8, wherein the stabilizing elements (22) comprise piezoelectric layers, each located perpendicular to the layered structure of the piezoelectric element (21; 31), which piezoelectric layers are triggered with a voltage in the same way as the piezoelectric element (21; 31).

15. The piezoelectric actuator of claim 9, wherein the stabilizing elements (22) comprise piezoelectric layers, each located perpendicular to the layered structure of the piezoelectric element (21; 31), which piezoelectric layers are triggered with a voltage in the same way as the piezoelectric element (21; 31).

16. The piezoelectric actuator of claim 10, wherein the stabilizing elements (22) comprise piezoelectric layers, each located perpendicular to the layered structure of the piezoelectric element (21; 31), which piezoelectric layers are triggered with a voltage in the same way as the piezoelectric element (21; 31).

* * * * *